United States Patent
Iwasaki et al.

(10) Patent No.: US 6,864,021 B2
(45) Date of Patent: Mar. 8, 2005

(54) PHOTOMASK AND PATTERN FORMING METHOD USED IN A THERMAL FLOW PROCESS AND SEMICONDUCTOR INTEGRATED CIRCUIT FABRICATED USING THE THERMAL FLOW PROCESS

(75) Inventors: Haruo Iwasaki, Tokyo (JP); Shinji Ishida, Tokyo (JP); Tsuyoshi Yoshii, Tokyo (JP)

(73) Assignee: NEC Electronics Corporation (JP)

( * ) Notice: Subject to any disclaimer, the term of this patent is extended or adjusted under 35 U.S.C. 154(b) by 115 days.

(21) Appl. No.: 10/341,160

(22) Filed: Jan. 13, 2003

(65) Prior Publication Data

US 2003/0104290 A1 Jun. 5, 2003

Related U.S. Application Data

(62) Division of application No. 09/757,841, filed on Jan. 10, 2001, now Pat. No. 6,566,041.

(30) Foreign Application Priority Data

Jan. 11, 2000 (JP) ........................................ 2000-002582

(51) Int. Cl.[7] .............................................. G03F 9/00
(52) U.S. Cl. ......................................................... 430/5
(58) Field of Search ............................ 430/5, 322, 330, 430/396

(56) References Cited

U.S. PATENT DOCUMENTS 4,224,361 A * 9/1980 Romankiw .................. 427/259
6,265,306 B1 * 7/2001 Starnes et al. .............. 438/632
6,486,058 B1 * 11/2002 Chun .......................... 438/637

FOREIGN PATENT DOCUMENTS

| JP | 10-083087 | 3/1998 | ............. G03F/7/40 |
| JP | 10-274854 | * 10/1998 | ............. G03F/7/40 |

* cited by examiner

Primary Examiner—S. Rosasco
(74) Attorney, Agent, or Firm—Hayes Soloway P.C.

(57) ABSTRACT

The invention relates to a photomask for use in a thermal flow process in which: a photomask is prepared in which a plurality of exposure openings are formed; a resist is applied to the surface of a layer of a semiconductor integrated circuit that is to undergo processing; this resist is patterned by an exposure process through the photomask to form a plurality of openings in the resist that correspond to each of the exposure openings; and the patterned resist is then heated to cause each of the openings to shrink; wherein at least a portion of exposure openings among the plurality of exposure openings are formed in shapes that compensate for anisotropic deformation that occurs in the openings when the patterned resist is heated to cause each of the openings to shrink. Since the openings that are formed in the resist are provided in advance with shapes that compensate for the deformation that occurs when the openings shrink, these openings attain the proper shape after undergoing shrinking and deformation.

8 Claims, 7 Drawing Sheets

PHOTOMASK AND PATTERN FORMING METHOD USED IN A THERMAL FLOW PROCESS AND SEMICONDUCTOR INTEGRATED CIRCUIT FABRICATED USING THE THERMAL FLOW PROCESS

CROSS REFERENCE TO RELATED APPLICATION

This application is a Divisional Application of U.S. application Ser. No. 09/757,841, filed Jan. 10, 2001 now U.S. Pat. No. 6,566,041.

BACKGROUND OF THE INVENTION

1. Field of the Invention

The present invention relates to a photomask used in a thermal flow process, a method of forming patterns used in a thermal flow process, and a semiconductor integrated circuit in which a portion having fine planar shapes is treated by a prescribed process through openings in a resist.

2. Description of the Related Art

In recent years, fine-patterned semiconductor integrated circuits constructed by using thin-film techniques are being used for a variety of purposes, and these constructions are increasing in fineness with each year. As an example, photolithography is one technique for achieving fine patterning of the layers of a semiconductor integrated circuit.

In a case of forming through-holes in the insulating film of a semiconductor integrated circuit, a resist is applied to the surface of the insulating film that is to undergo processing, and the resist is then exposed using a photomask in which a plurality of exposure openings are formed. The resist is then developed to form openings at the exposed portions, and this resist is used as a mask to etch the insulating film through the openings.

This type of photolithography is used not only for the formation of through-holes described above but for various other purposes such as introducing impurities into a semiconductor substrate and patterning wiring lines. In this type of photolithography, a photomask is formed in which the pattern that is to be exposed is enlarged in all directions, following which the exposure process is carried out with this photomask using reducing optics to expose a pattern of the desired dimensions on the resist.

In this technique, a pattern that is finer than a prescribed dimension cannot be exposed due to the limits of optical resolution. However, there is now demand to reduce resist openings below the exposure limit dimensions, and the thermal flow process has been developed as a means of realizing such a reduction.

Referring now to FIG. 1A-FIG. 2C, one example of the thermal flow process of the prior art is next described.

Figure 1A:
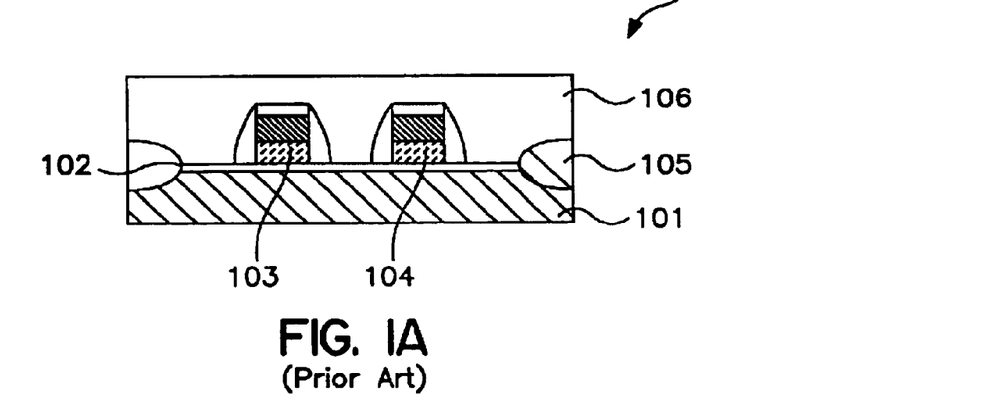
FIGS. 1A–1C and FIGS. 2A–2C are schematic vertical section frontal views showing a semiconductor integrated circuit that is to undergo processing for explaining an example of a thermal flow process of the prior art.

As shown in FIG. 1A, a DRAM (Dynamic Random Access Memory) that is in the process of fabrication is first prepared as semiconductor integrated circuit 100, which is the object of processing. In semiconductor integrated circuit 100 that is here taken as an example, gate oxide film 102 is formed on the surface of semiconductor substrate 101, and gate electrodes 103 and 104 of the transistor elements that will serve as memory cells are formed in a prescribed pattern on the surface of this gate oxide film 102. Gate oxide film 102 is partitioned by element isolation regions 105 according to the positions of memory cells, and the space around gate electrodes 103 and 104 is filled with interlayer dielectric film 106, which is a prescribed layer.

Figure 1C:
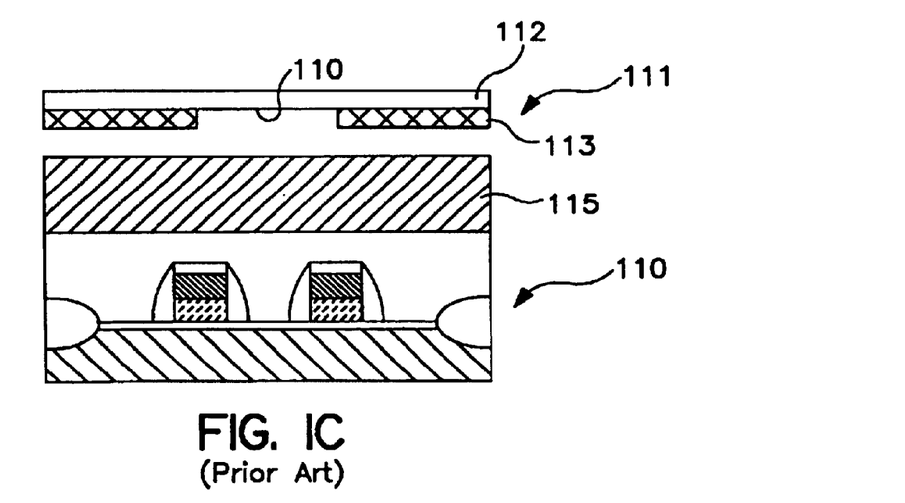
Figure 2A:
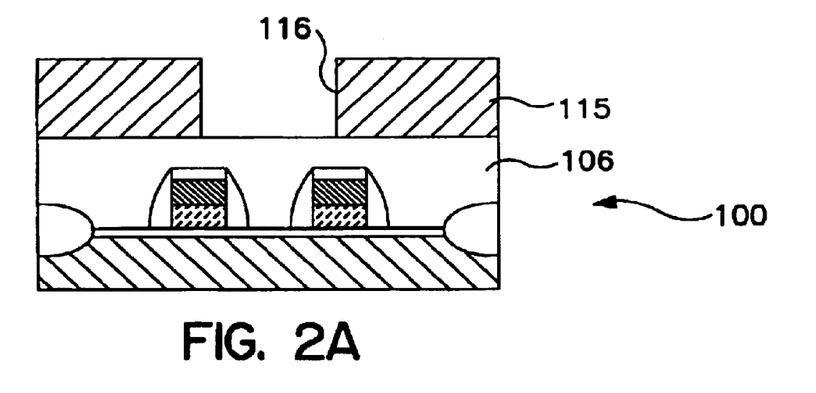
Figure 2B:
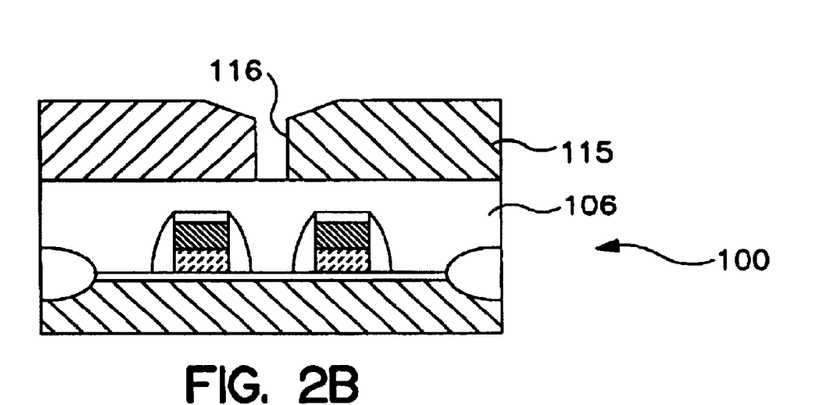
Figure 2C:
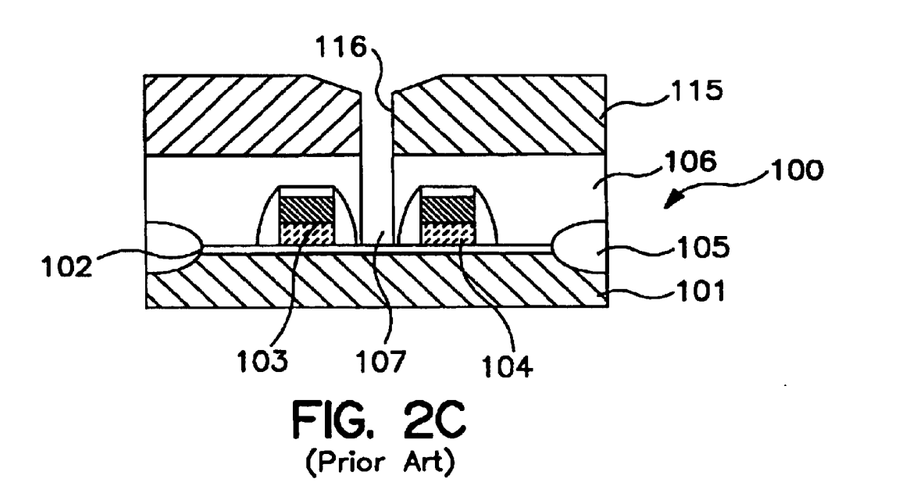

In semiconductor integrated circuit 100 which is taken as an example here, contact hole 107 of a bit contact is formed from the surface of interlayer dielectric film 106 to the surface of gate oxide film 102 at a position between the pair of gate electrodes 103 and 104, as shown in FIG. 2C. Photomask 111, in which is formed exposure opening 110 that corresponds to this contact hole 107, is therefore prepared as shown in FIG. 1C.

The structure of this photomask 111 is such that shield film 113 is formed on the underside of transparent base member 112 and exposure opening 110 is formed by partially removing this shield film 113. This exposure opening 110 is formed at position that corresponds to contact hole 107, and its dimensions in all directions are greater than the dimensions of contact hole 107.

Figure 1B:
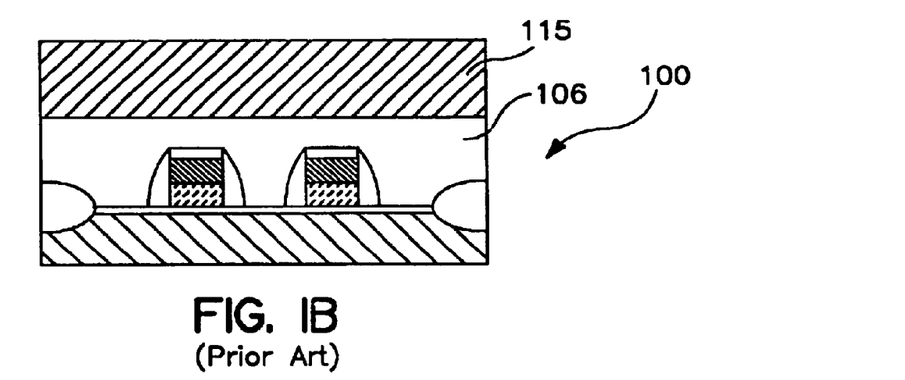

Resist 115 is then applied to the surface of interlayer dielectric film 106, which is a prescribed layer of semiconductor integrated circuit 100, to form a prescribed film thickness as shown in FIG. 1B, and the above-described photomask 111 is arranged parallel to and confronting the surface of resist 115 at a prescribed distance from the surface of resist 115.

In this configuration, resist 115 is exposed to light by exposure device (not shown in the figure) through exposure opening 110 of photomask 111, and as shown in FIG. 2A, this resist 115 is then developed to form opening 116 that corresponds to exposure opening 110. In the photolithographic technique of the prior art, a contact hole is formed in interlayer dielectric film 106 of semiconductor integrated circuit 100 through this opening 116 in resist 115.

However, since it is impossible to form contact hole 107 of a diameter that is still smaller than the dimension limited by exposure resolution, resist 115 that has been patterned as described hereinabove is heated and softened in a thermal flow process to shrink opening 116 as shown in FIG. 2B.

Since opening 116 of resist 115 thus attains a diameter that is smaller than the exposure limit dimension, an extremely small diameter contact hole 107 can be formed from the surface of interlayer dielectric film 106 to the surface of gate oxide film 102 by etching interlayer dielectric film 106 of semiconductor integrated circuit 100 through opening 116 in resist 115.

Exposure opening 110 of photomask 111, which is used in the exposure process in the above-described thermal flow process, is therefore formed at dimensions that approach the limit dimensions of the exposure process and in a shape that is an enlargement in all directions of opening 116 that has been shrunk by heating resist 115.

When the dimensions of exposure opening 110 approach the exposure limit dimensions, the shape of an exposure beam that passes through exposure opening 110 is deformed by such factors as diffraction. The shape of the exposure of opening 116 in resist 115 is therefore roughly oval in shape even though exposure opening 110 is square, and the shape of opening 116 following the thermal flow process becomes approximately circular.

Since no problem is raised if the plan shape of contact hole 107 that is formed at the exposure limit dimensions as described above is substantially circular, exposure opening 110 of photomask 111 is typically formed as a square in order to simplify design and fabrication. As a result, in a case in which the exposure dimension of opening 116 in resist 115 is set to a circle of diameter "a", exposure opening 110 of photomask 111 is formed as a square having sides of length "a".

In the interest of simplifying the explanation here, a case is described in which the process of exposing resist 115 using photomask 111 is carried out in equal proportions, but in a case in which the exposure process is performed in the above-described exposure limit dimensions, the pattern of openings of photomask 111 is typically exposed on resist 115 in a form that is reduced by reduction optics.

After forming opening 116 in resist 115 by an exposure process using photomask 111 in the above-described thermal flow process, this resist 115 is heated to shrink opening 116, whereby a process can be performed on interlayer dielectric film 106 at dimensions that are smaller than the exposure limit dimension.

Nevertheless, when resist 115 is heated and softened to shrink opening 116 that was formed by the exposure process as described hereinabove, opening 116 deforms as it shrinks due to the surface tension of this resist 115. It has been confirmed by the inventors of this invention that this deformation occurs in accordance with the positional relationships between the plurality of openings 116. Specifically, when shrinking a plurality of openings 116 by heating resist 115, the degree of shrinkage at each of openings 116 that are close to each other is smaller in the direction between openings 116 while the degree of shrinking is greater in the direction orthogonal to this direction.

Figure 3A:
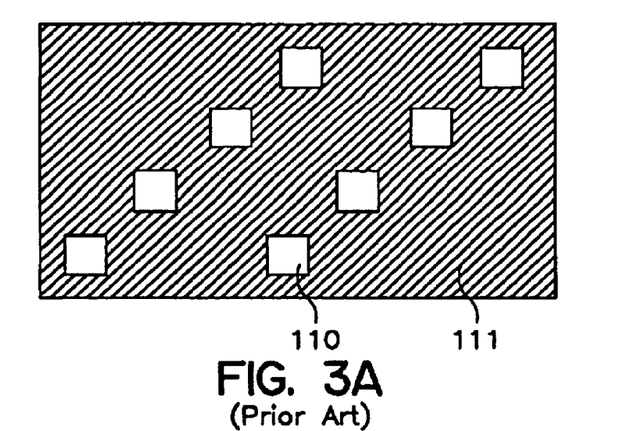
FIG. 3A is a plan view showing an example of a photomask of the prior art.

In some types of high-integration DRAM referred to as "¼ pitch DRAM," for example, a plurality of contact holes 107 are arranged linearly in a direction that is inclined 45° from the directions of arrangement of the bit lines and word lines. Photomask 111 for forming such a plurality of contact holes 107 has a shape in which a plurality of square exposure openings 110 are arranged in a line in a 45° direction, as shown in FIG. 3A.

Figure 3B:
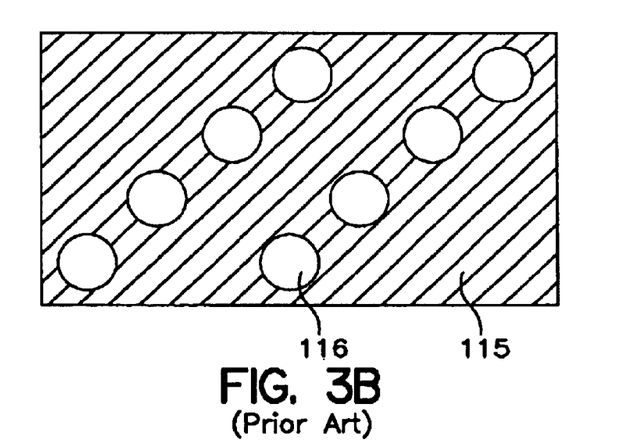
FIG. 3B is a plan view showing a resist in which openings have been formed by exposure using the photomask shown in FIG. 3A.
Figure 3C:
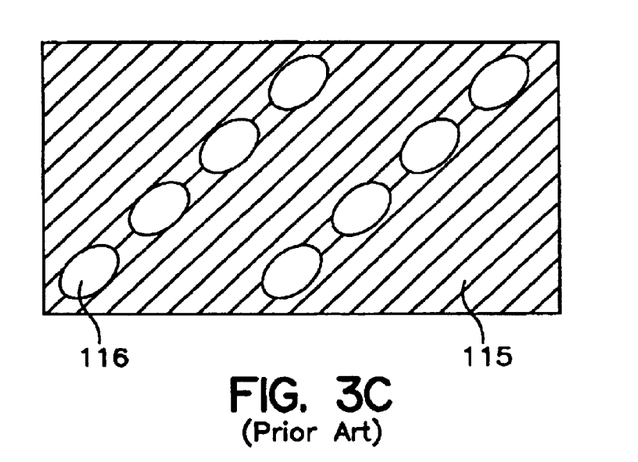
FIG. 3C is a plan view showing the state of openings that have been caused to shrink by heating the resist shown in FIG. 3B.

When resist 115 is exposed using this type of photomask 111, a plurality of round openings 116 is thus arranged in a line in a 45° direction, as shown in FIG. 3B. When this resist 115 is heated and openings 116 are caused to shrink, however, the degree of shrinkage in the direction of arrangement is small, while the degree of shrinkage in the direction orthogonal to this direction is great, and, as shown in FIG. 3C, each of openings 116 therefore forms an oval that is elongated in the direction of arrangement of openings 116.

In a thermal flow process of the prior art, the formation of openings 116 of a desired shape in desired positions is problematic due to deformation according to the positional relationship between the plurality of openings 116, as described in the foregoing explanation, and the proper realization of prescribed fine processing on semiconductor integrated circuit 100 is therefore also problematic.

SUMMARY OF THE INVENTION

It is an object of the present invention to provide a photomask that can properly realize prescribed fine processing on a semiconductor integrated circuit in a thermal flow process; a pattern forming method that can properly realize prescribed fine processing on a semiconductor integrated circuit in a thermal flow process; and a semiconductor integrated circuit in which prescribed fine processing is properly realized.

According to one aspect of the present invention, a photomask is used in a thermal flow process in which: a photomask is prepared in which a plurality of exposure openings are formed; a resist is applied to the surface of the layer of a semiconductor integrated circuit that is to undergo processing; the resist is patterned by an exposure process through the photomask to form a plurality of openings in the resist that correspond to each of the exposure openings; and the resist in which the patterning has been carried out is heated to cause each of the openings to shrink; wherein at least a portion of the exposure openings among the plurality of exposure openings are formed in a shape that compensates for the anisotropic deformation that occurs in the openings when each of the openings is caused to shrink by heating the patterned resist. In the thermal flow process that uses the photomask of the present invention, when the resist that is applied to the surface of a layer of a semiconductor integrated circuit that is to undergo processing is patterned by an exposure process by means of the photomask and a plurality of openings are formed in the resist that correspond to the plurality of exposure openings that are formed in the photomask, these openings are formed in a shape that compensates for the anisotropic deformation that occurs when the resist is heated to cause each of the openings to shrink. When the resist that has been thus patterned is heated and the openings are caused to shrink, these openings are anisotropically deformed as they shrink. However, since each of the openings has been formed in advance in a shape that compensates for this anisotropic deformation, the openings attain the proper shape after shrinkage and deformation.

At least a portion of exposure openings among the plurality of exposure openings may be formed in a shape that is elongated in a direction that is approximately orthogonal to the direction toward other exposure openings that are close. At least a portion of exposure openings among the plurality of exposure openings may also be enlarged in a direction that is approximately orthogonal to the direction toward other exposure openings that are close. The degree of enlargement of said exposure openings becomes smaller as the distance among said other exposure openings that are close becomes larger. When the plurality of openings that have been formed in this way are caused to shrink by heating the resist, the plurality of openings that neighbor each other attain the proper shape upon shrinking because the degree of shrinkage is smaller in the direction toward other openings while the degree of shrinkage is greater in the direction orthogonal to this direction due to such factors as the surface tension of the resist.

At least a portion of the exposure openings among the plurality of exposure openings are arranged in lines that are close together, and each of the exposure openings that are arranged in these lines may be enlarged in the direction that is approximately orthogonal to the direction of this arrangement.

The exposure openings may be formed in a rectangular shape in which the direction of enlargement is the direction in which the long sides extend.

Each of the exposure openings may be enlarged in substantially all directions, and at least a portion of the exposure openings among the plurality of exposure openings may be formed such that the degree of enlargement is smaller in the direction toward other exposure openings than other directions that are close.

At least a portion of the exposure openings among the plurality of exposure openings may be formed as rectangles in which the short sides extend in the direction toward other exposure openings that are close and the long sides extend in a direction that is approximately orthogonal to this direction.

The term "enlargement of the openings in the resist" in this invention assumes the dimensions before the openings are caused to shrink by the thermal flow process with respect to the final desired dimension of the openings that have been caused to shrink by the thermal flow process, and thus indicates that the dimensions of exposure of the resist are made greater.

For example, if the diameter of round openings that are caused to shrink by the thermal flow process is "a" and the openings are caused to shrink to "1/b" by the thermal flow process, the openings before being caused to shrink by the thermal flow process are circles having a diameter of "a×b," but in the present invention, the exposure dimension of the resist openings is made "a×b" or greater in the direction of enlargement.

In addition, the term "enlargement of exposure openings in the photomask" in the present invention means that, when forming openings of a desired dimension in the resist, the exposure openings are made larger than dimensions that are designed based merely on these openings. For example, in a case in which the diameter of circular openings that are caused to shrink by the thermal flow process as described hereinabove is "a" and the openings are caused to shrink to "1/b" by the thermal flow process, the openings before being caused to shrink by the thermal flow process are circles of diameter "a×b." If the exposure optics are equal power, square exposure openings measuring "a×b" on each side would be formed in the photomask, but in the present invention, the exposure openings that are formed in the photomask are rectangles in which the short sides are "a×b" in length and the long sides are longer than "a×b."

Furthermore, "approximately all directions" in the present invention means substantially all directions involved in the formation of the exposure openings and includes 360° of the two-dimensional directions that are parallel to the surface of the photomask, the four directions to the left and right and forward and rear that are parallel to the surface of the photomask, and the two directions that are parallel to the four sides of the exposure openings that are formed in a rectangular shape.

The pattern forming method according to another aspect of the present invention is a pattern forming method used in a thermal flow process in which: a resist is applied to a surface of the layers of a semiconductor integrated circuit that is to undergo processing; the resist is patterned to form a plurality of openings in the resist; and the resist that has been patterned is heated to cause each of the openings to shrink; wherein at least a portion of exposure openings among said plurality of exposure openings are formed in shapes so that said openings are caused to become corresponding desired shapes due to anisotropic deformation that occurs in said openings when said resist that has been patterned is heated to cause said openings to shrink.

The pattern forming method according to another aspect of the present invention is a pattern forming method used in a thermal flow process in which: a photomask is prepared in which a plurality of exposure openings are formed; a resist is applied to a surface of the layers of a semiconductor integrated circuit that is to undergo processing; this resist is patterned by an exposure process through the photomask to form a plurality of openings in the resist that correspond to the exposure openings; and the patterned resist is heated to cause each of the openings to shrink; wherein the photomask of the present invention is used during the exposure process.

According to another aspect of the present invention, a prescribed portion of a semiconductor integrated circuit having fine planar shapes is treated by a prescribed process through openings in a resist that have been formed by the method of forming patterns of the above-described invention.

The above and other objects, features, and advantages of the present invention will become apparent from the following description with reference to the accompanying drawings which illustrate examples of the present invention.

DETAILED DESCRIPTION OF THE PREFERRED EMBODIMENTS

An embodiment according to the present invention will be described below with reference to FIGS. 4A–4C and FIG. 5. Components of this embodiment that are identical to components of the above-described example of the prior art are identified by the same term, and detailed explanation is omitted.

Figure 4A:
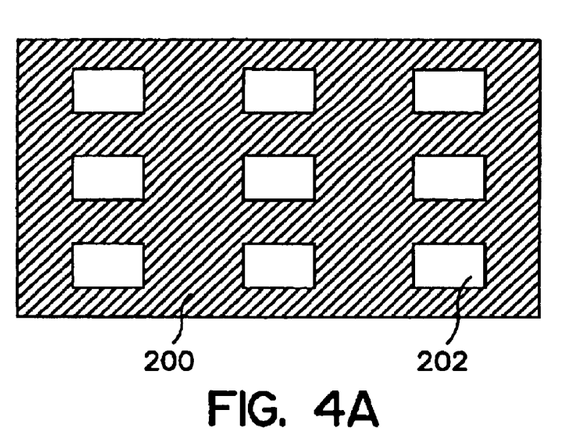
FIG. 4A is a plan view showing one embodiment of the photomask according to the present invention.
Figure 4B:
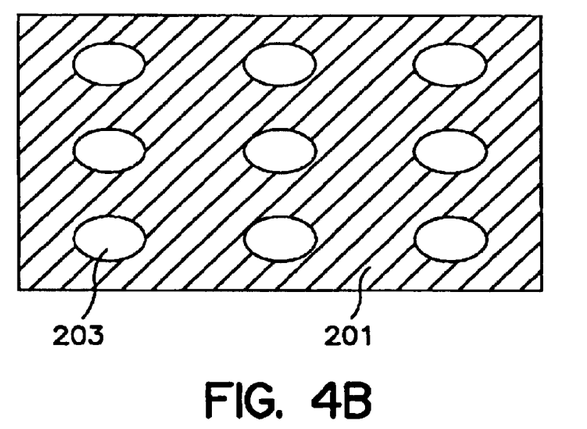
FIG. 4B is a plan view showing a resist in which openings have been formed by exposure using the photomask shown in FIG. 4A.
Figure 4C:
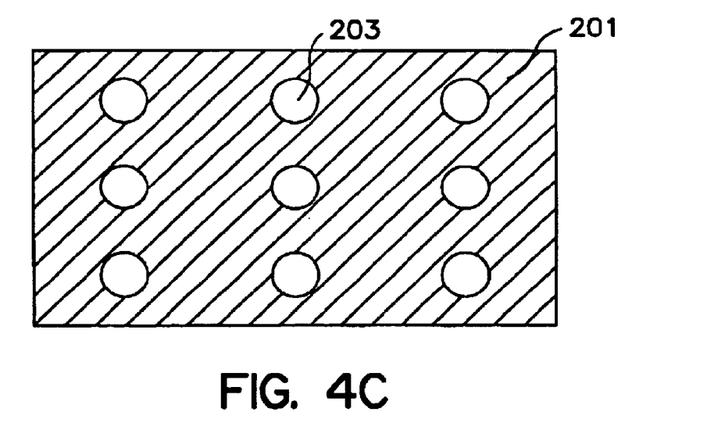
FIG. 4C is a plan view showing the state of openings that have been caused to shrink by heating the resist shown in FIG. 4B.

As shown in FIGS. 4A–4C, photomask 200 of this embodiment is also used to pattern resist 201 in a thermal flow process, and a plurality of exposure openings 202 are formed corresponding to the processing positions of a semiconductor integrated circuit (not shown in the figure) that is to undergo processing.

In more detail, in the pattern forming method of this embodiment, for example, nine openings 203 arranged in three rows and three columns are formed in resist 201, which is applied to the surface of semiconductor integrated circuit, as shown in FIG. 4C. The distances between these openings 203 is relatively small in the direction from front to back (vertical direction in the figure) and relatively large in the direction from left to right.

In the present embodiment as well, nine exposure openings 202 are formed on photomask 200 in three rows and three columns that are close to each other in the front and rear directions but distant from each other toward the right and left, as shown in FIG. 4A, but these exposure openings 202 are formed in a shape that compensates for the anisotropic deformation that occurs in openings 203 when resist 201 is heated to cause openings 203 to shrink.

In other words, in photomask 200 of this embodiment, each of the plurality of exposure openings 202 that are close to each other in the front and rear directions but distant from each other toward the left and right is formed in a rectangular shape, which is a square that has been enlarged toward the right and left. As a result, in photomask 200 of this embodiment, each of the plurality of exposure openings 202 that are close to each other toward the front and rear and arranged in lines is enlarged toward the left and right, which are directions orthogonal to the direction of arrangement. As a result, these exposure openings 202 are formed as rectangles having long sides that extend in the left and right directions, which are the directions of enlargement, and the sides that extend in the front and rear directions toward the other nearby exposure openings 202 are therefore the directions in which the short sides of these rectangles extend.

In the pattern forming method of this embodiment, however, each of the plurality of exposure openings 202 of photomask 200 is actually enlarged in almost all directions compared to the dimensions of opening 203 for the exposure process in resist 201. However, the degree of enlargement of these exposure openings 202 is small in the front and rear directions that extend toward other closely neighboring exposure openings 202, and exposure openings 202 are thus formed as shapes that are expanded toward the left and right.

Exposure openings 202, which are arranged both toward the front and rear and toward the right and left of photomask 200 as described in the foregoing explanation, are also close to each other toward the right and left, although not as close as toward the front and rear, and exposure openings 202 are therefore also enlarged toward the front and rear, which is the direction orthogonal to the right and left. As described above, however, the degree of enlargement of exposure openings 202 is great toward the left and right and small toward the front and rear, the degree of enlargement in each direction being inversely proportional to the distance to a neighboring opening in that direction.

A brief explanation is next presented regarding a thermal flow process that uses photomask 200 of this embodiment in the above-described construction.

First, resist 201 is applied to the surface of the semiconductor integrated circuit that is to undergo processing, and this resist 201 is then patterned by means of an exposure process by photomask 200.

Then, as shown in FIG. 4B, a plurality of openings 203 corresponding to the plurality of exposure openings 202 of photomask 200 are formed in resist 201. When this resist 201 is heated and each of openings 203 is caused to shrink, openings 203 of resist 201 attain a small diameter that is less than the exposure limit dimensions, whereby a desired process can be performed in a fine area of a semiconductor integrated circuit.

Figure 5:
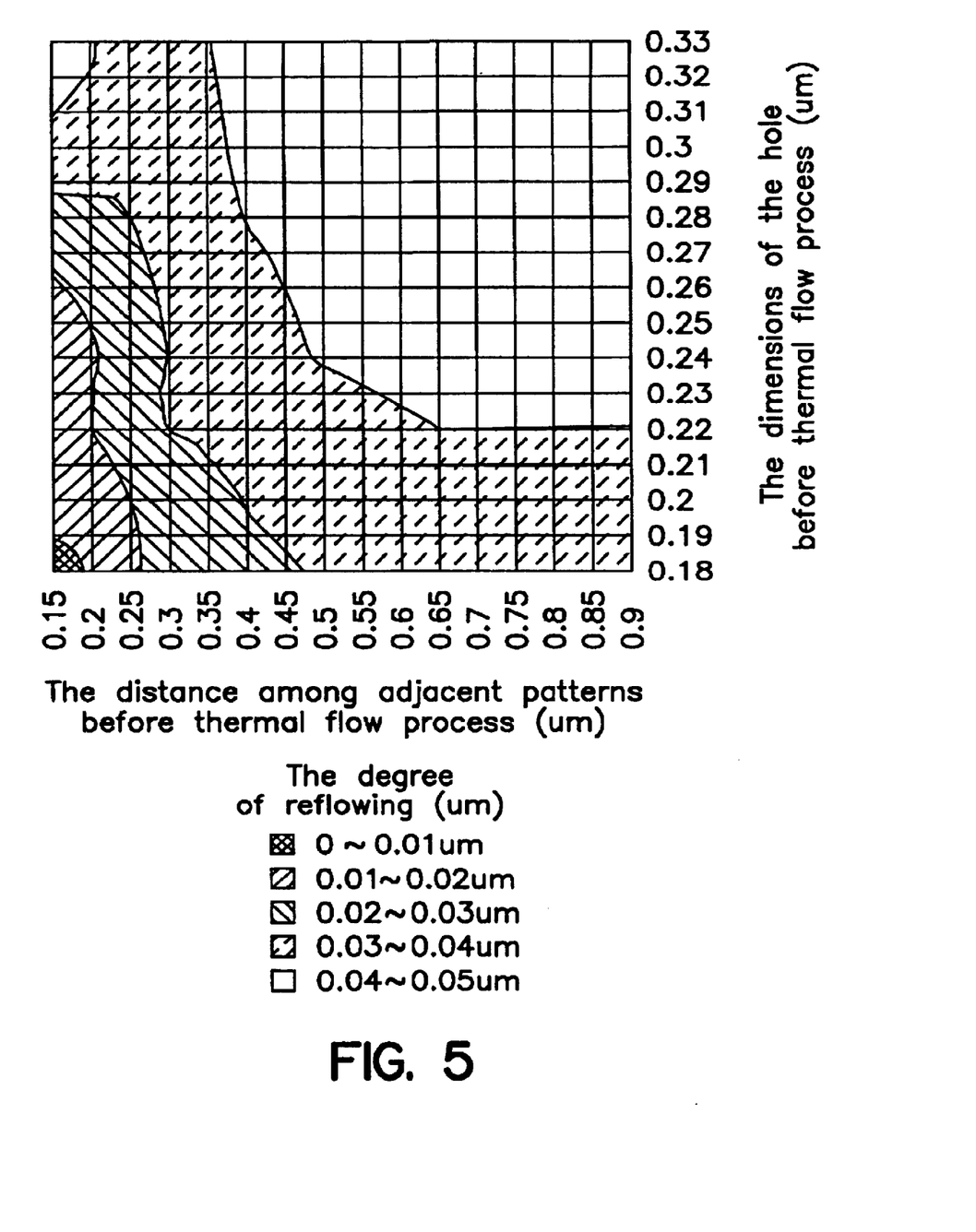
FIG. 5 is a characteristics chart showing the degree of deformation of the openings caused by heating of the resist.

When resist 201 is heated and each of openings 203 is caused to shrink as described hereinabove, however, anisotropic deformation occurs according to the positional relationship between these openings 203. The deformation of these openings 203 is believed to arise due to such factors as the surface tension of resist 201. When openings 203 are caused to shrink by heating resist 201, the degree of shrinkage in openings 203 that are close to each other is small in the directions toward the other openings while the degree of shrinking is great in the direction that is orthogonal to this direction, as shown in FIG. 5.

However, since exposure openings 202 in photomask 200 of this embodiment are formed in shapes that compensate for the anisotropic deformation of openings 203 as shown in FIG. 4A, openings 203 that are formed in resist 201 by an exposure process that uses this photomask 200 are formed in an oval shape that is enlarged in the direction that is substantially orthogonal to the direction toward other openings 203 that are close, as shown in FIG. 4B. When the plurality of openings 203 that are thus formed are caused to shrink by heating resist 201, openings 203 assume a substantially circular shape as shown in FIG. 4C due to the occurrence of anisotropic deformation according to the positional relation between the openings.

As a result, fine openings 203 can be formed in a proper shape in resist 201 in a thermal flow process that uses photomask 200 of this embodiment, and appropriate processing can thus be realized in a fine area of semiconductor integrated circuit. In photomask 200 of this embodiment, moreover, each of exposure openings 202 is formed as a rectangle in which the right and left directions, which are the directions of chief enlargement, are the directions in which the long sides extend, and the design and fabrication of of the photomask is thus facilitated.

The present invention is not limited to the above-described embodiment, and various modifications are possible in the scope or spirit of the invention. For example, in the above-described embodiment, an example was described in which openings 203 of a desired shape were formed on resist 201 by a photolithographic technique using photomask 200, but these openings 203 may also be formed on resist 201 by a direct writing technique that does not use photomask 200.

Although a case was described in the above-described embodiment in which openings 203 that were formed on resist 201 were arranged in lines extending toward the front and rear, openings 203 may also arranged linearly in a direction that is at an angle, as in the previously described example of ¼-pitch DRAM of the prior art. Simply adapting the above-described photomask 200 to this type of arrangement, however, means that the exposure openings that were originally square must be enlarged in a direction that extends at an angle. The exposure openings must therefore be enlarged to form a parallelogram or diamond shape, and this complicates the design and fabrication of the photomask.

Figure 6A:
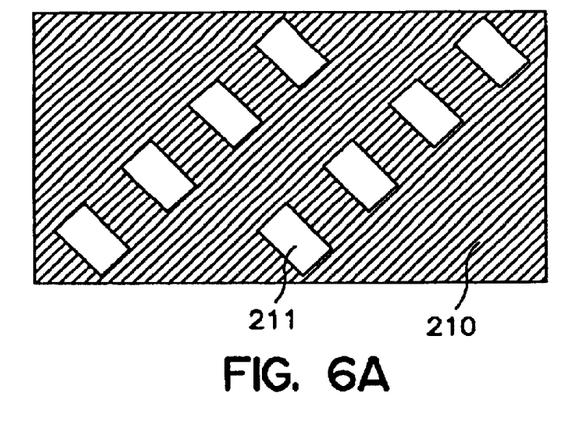
FIG. 6A is a plan view showing the first modification of the photomask according to the present invention.

When this becomes a problem, a plurality of exposure openings 211 of photomask 210 are formed in rectangular shapes in which the long sides extend in an oblique direction that is orthogonal to direction of arrangement of these openings 211.

Figure 6B:
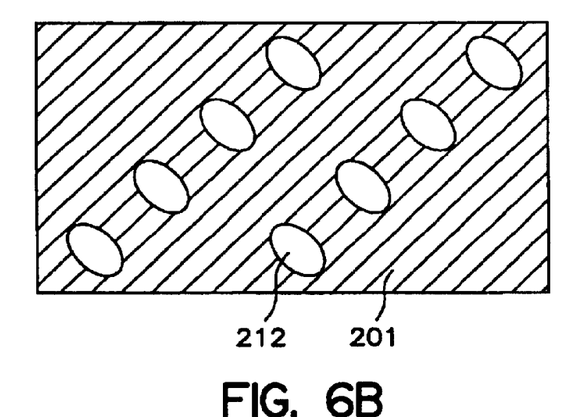
FIG. 6B is a plan view showing the resist in which openings have been formed by exposure using the photomask shown in FIG. 6A.
Figure 6C:
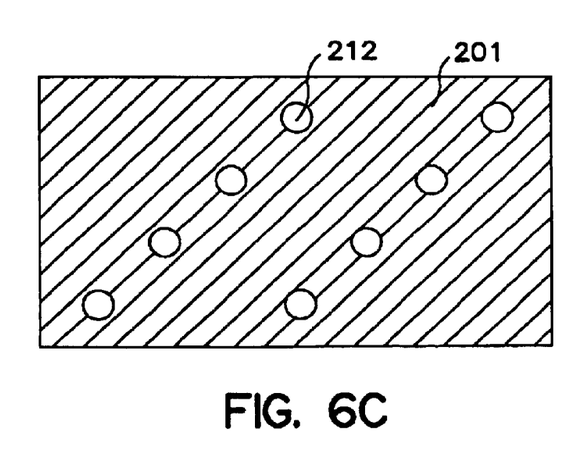
FIG. 6C is a plan view showing the state of openings that have been caused to shrink by heating the resist shown in FIG. 6B.

In this case, a plurality of openings 212 are formed as inclined oval shapes in resist 201 as shown in FIG. 6B, and these oval openings 212 are enlarged in directions that are orthogonal to the direction in which the openings are close to each other, whereby these openings 212 become proper circles when caused to shrink by heating resist 201.

The inventors of the present invention actually produced photomask 210 on an experimental basis in which openings 212 in resist 201 were arranged in a 45° direction as described in the foregoing explanation. In this case, the average diameter of openings 212 in resist 201 that were caused to shrink by heating resist 201 was set to 0.15 μm, and the pitch toward the front and rear as well as to the right and left of the plurality of openings 212 that were arranged in a 45° direction was set to 0.3 μm.

Figure 7:
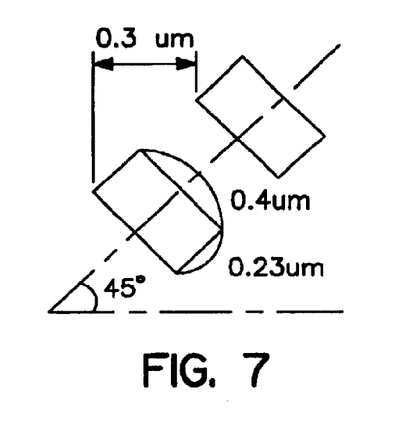
FIG. 7 is a plan view showing an actual example of the dimensions of each part of a photomask according to the present invention.

Taking into consideration the data of FIG. 5, exposure openings 211 of photomask 210 were formed in rectangular shapes with short sides of 0.23 μm and long sides of 0.4 μm as shown in FIG. 7, and it was confirmed that openings 212 were finally formed having substantially the above-described dimensions.

In the above-described embodiment, an example was described in which regularly arranged openings 203 were formed in resist 201, but the present invention may also be adapted to a case in which irregularly arranged openings 203 are formed in resist 201. It is also obvious that the conditions of deformation for openings of identical shape that are arranged in a line at uniform intervals as described herein-above will differ for openings at the two ends and for openings in the central area.

Figure 8A:
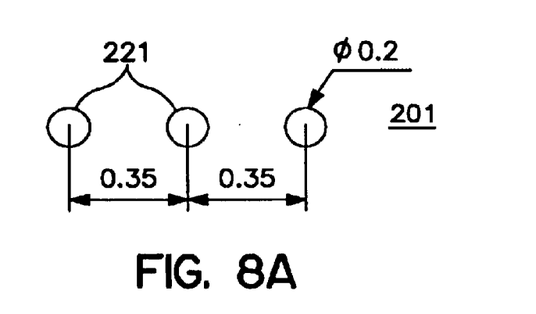
FIG. 8A is a plan view showing a modification of the exposure pattern formed on the resist.

However, the inventors designed photomask 222 in which all of openings 221 can be formed in proper shape assuming three openings 221 having a diameter of 0.2 μm are arranged in resist 201 in a line at a pitch of 0.35 μm as shown in FIG. 8A.

Figure 8B:
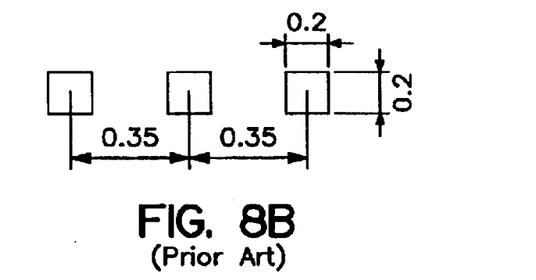
FIG. 8B is a plan view showing the pattern of openings that are formed on the photomask of the prior art.
Figure 8C:
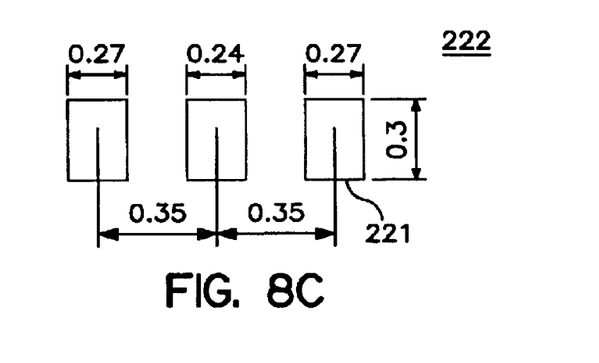
FIG. 8C is a plan view showing the pattern of openings that are formed on a photomask of the present invention.

In a photomask of the prior art in such a case, three square exposure openings measuring 0.2 μm on each side are arranged in a line at a pitch of 0.35 μm as shown in FIG. 8B. In contrast, it was confirmed that in photomask 222 of this invention, central exposure openings 223 are preferably formed as rectangles measuring 0.24×0.30 μm and exposure openings 223 at the two ends are preferably formed as rectangles measuring 0.27×0.30 μm, as shown in FIG. 8C. In other words, in a case in which a plurality of exposure openings 223 are arranged in a line, the degree of enlargement in the direction of arrangement of exposure openings 223 at both ends is preferably greater than the degree of enlargement of exposure openings 223 in the central area.

Among the above-described embodiments, a case was described in which exposure openings 202 of photomask 200 were enlarged in substantially all directions, i.e., toward the front, rear, left and right, with the degree of this enlargement for the front-rear directions differing from that for the left-right directions. However, it is also possible for exposure openings 202 to be enlarged in only specific directions.

While preferred embodiments of the present invention have been described using specific terms, such description is for illustrative purposes only, and it is to be understood that changes and variations may be made without departing from the spirit or scope of the following claims.

What is claimed is:

1. A photomask for use in a thermal flow process in which: a photomask is prepared in which a plurality of exposure openings are formed; a resist is applied to the surface of a layer of a semiconductor integrated circuit that is to undergo processing; said resist is patterned by an exposure process through said photomask to form a plurality of openings in said resist that correspond to each of said exposure openings; and said resist that has been patterned is heated to cause each of said openings to shrink;

wherein at least a portion of exposure openings among said plurality of exposure openings are formed in shapes so that said openings are caused to become corresponding desired shapes due to anisotropic deformation that occurs when each of said openings is caused to shrink by heating said resist on which the patterning has bees carried out.

2. A photomask according to claim 1 wherein at least a portion of exposure openings among said plurality of exposure openings are formed in shapes that are elongated in a direction that is approximately orthogonal to the direction toward other said exposure openings that are close.

3. A photomask according to claim 2 wherein at least a portion of exposure openings among said plurality of exposure openings are enlarged in a direction that is approximately orthogonal to the direction toward said other exposure openings that are close.

4. A photomask according to claim 3 wherein the degree of enlargement of said exposure openings becomes smaller as the distance among said other exposure openings that are close become larger.

5. A photomask according to claim 3 wherein said exposure openings are formed in rectangular shapes in which the direction of enlargement is the direction in which the long sides extend.

6. A photomask according to claim 2 wherein at least a portion of exposure openings among said plurality of exposure openings are arranged in lines that are close together, and each of said exposure openings that are arranged in these lines is enlarged in a direction that is approximately orthogonal to the direction of said arrangement.

7. A photomask according to claim 2 wherein each of said exposure openings is enlarged in substantially all directions, and at least a portion of exposure openings among said plurality of exposure openings are formed such that the degree of enlargement is smaller in the direction toward other exposure openings that are close than other directions.

8. A photomask according to claim 7 at least a portion of exposure openings among said plurality of exposure openings are formed as rectangles in which the short sides extend in the direction toward said other exposure openings that are close and the long sides extend a direction that is approximately orthogonal to this direction.

* * * * *

UNITED STATES PATENT AND TRADEMARK OFFICE
CERTIFICATE OF CORRECTION

PATENT NO. : 6,864,021 B2
DATED : March 8, 2005
INVENTOR(S) : Iwasaki et al.

It is certified that error appears in the above-identified patent and that said Letters Patent is hereby corrected as shown below:

Column 10,
Line 17, "bees" should be -- been --.

Signed and Sealed this

Seventh Day of June, 2005

JON W. DUDAS
*Director of the United States Patent and Trademark Office*